United States Patent [19]
Takahashi et al.

[11] Patent Number: 5,851,646
[45] Date of Patent: Dec. 22, 1998

[54] PREPREG, PROCESS FOR PRODUCING THE SAME AND PRINTED CIRCUIT SUBSTRATE/BOARD USING THE SAME

[75] Inventors: Tsutomu Takahashi; Yoshifumi Tsujimoto; Hiroaki Kumada; Hiroyuki Sato, all of Ibaraki, Japan

[73] Assignee: Sumitomo Chemical Company, Limited, Osaka, Japan

[21] Appl. No.: 732,577

[22] Filed: Oct. 15, 1996

[30] Foreign Application Priority Data

Oct. 16, 1995 [JP] Japan .................................. 7-267040
Apr. 1, 1996 [JP] Japan .................................. 8-078739

[51] Int. Cl.$^6$ .............................. B32B 5/28; B32B 5/26; B32B 17/04
[52] U.S. Cl. ...................... 428/294.1; 428/361; 428/378; 428/395; 428/408; 428/457; 428/474.4; 428/902; 428/910; 428/298.7; 428/304.4; 442/60; 442/168; 442/169; 174/256; 361/750
[58] Field of Search .................. 428/294.1, 361, 428/395, 378, 408, 457, 474.4, 902, 910; 442/60, 168, 169; 174/250, 256; 361/750

[56] References Cited

U.S. PATENT DOCUMENTS

| | | | |
|---|---|---|---|
| 3,530,087 | 9/1970 | Hayes et al. | 260/37 |
| 4,775,583 | 10/1988 | Kawamura | 428/294 |
| 5,002,637 | 3/1991 | Toyoshima et al. | 162/137 |
| 5,314,742 | 5/1994 | Kirayoglu et al. | 428/285 |

FOREIGN PATENT DOCUMENTS

| | | |
|---|---|---|
| 57-16545 | 10/1982 | Japan . |
| 3237135 | 10/1991 | Japan . |
| 425535 | 1/1992 | Japan . |
| 4117433 | 4/1992 | Japan . |
| 5327148 | 12/1993 | Japan . |
| 62525555 | 9/1994 | Japan . |
| 7147464 | 6/1995 | Japan . |
| A2060490 | 5/1981 | United Kingdom . |
| WO93/00389 | 1/1993 | WIPO . |

OTHER PUBLICATIONS

Chemical Abstracts, Abstract of JP–A 5–327148.

*Primary Examiner*—Cathy F. Lam
*Attorney, Agent, or Firm*—Sughrue, Mion, Zinn, Macpeak & Seas, PLLC

[57] ABSTRACT

The present invention provides a lightweight prepreg having uniform formation, low linear thermal expansion coefficient and good mechanical strength, comprising a porous para-oriented aromatic polyamide film and a thermoplastic resin and/or a thermosetting resin, the porous para-oriented aromatic polyamide film being impregnated with the thermoplastic resin and/or the thermosetting resin, a process for producing the same, and a printed circuit substrate/board using the same.

5 Claims, No Drawings

PREPREG, PROCESS FOR PRODUCING THE SAME AND PRINTED CIRCUIT SUBSTRATE/BOARD USING THE SAME

FIELD OF THE INVENTION

The present invention relates to a prepreg, a process for producing the same, and a printed circuit substrate/board using the same. More particularly, it relates to a prepreg comprising a porous para-oriented aromatic polyamide film and a thermoplastic resin and/or a thermosetting resin, the porous para-oriented aromatic polyamide film being impregnated with the thermoplastic resin and/or thermosetting resin, a process for producing the same, and a printed circuit substrate/board as the use for using the same.

BACKGROUND OF THE INVENTION

In recent electronic instruments, a demand of a high-speed signal treatment and digitization for imparting high function have been increased more or more. A laminate comprising a nonwoven fabric of an aromatic polyamide (hereinafter referred to as an "aramid", sometimes) as a substrate has characteristics such as low dielectric constant, lightweight and low linear thermal expansion coefficient and it's application for such a field has been developed.

For example, U.S. Pat. No. 5,314,742 discloses that a nonwoven fabric comprising fibrils of a meta-oriented aromatic polyamide (hereinafter, referred to as a "meta-aramid", sometimes) and a para-oriented aromatic polyamide (hereinafter, referred to as a "para-aramid", sometimes) flock is useful as a substrate of a laminate having a low linear thermal expansion coefficient. In addition, Japanese Patent Kokai (Laid-Open) No. 5-327148 discloses that a linear thermal expansion coefficient in the planer direction can be reduced by using a cloth, paper or nonwoven fabric containing not less than 50% of para-aramid fibers as a substrate. However, the nonwoven fabric had a drawback that an uniform product can not be easily obtained as characteristics of the process.

In a board, those using a thermosetting resin such as a glass epoxy substrate have been exclusively used as a matrix resin together with a paper or nonwoven fabric, heretofore, and it is suggested to use the thermoplastic resin as the matrix resin as described in Japanese Patent Kokai (Laid-Open) No. 6-252555. The gazette discloses the improved structure when using a composite material prepared by impregnating a core material of the fiber fabric being with a thermoplastic resin as a multi-layer laminate. A matrix resin prepared by formulating a thermoplastic resin and a thermosetting resin in a predetermined proportion is also described, for example, in Japanese Patent Kokai (Laid-Open) No 57-165451 and U.S. Pat. No. 3,530,087. The former discloses a composition of a cyanate resin composition and polyether sulfon and the latter discloses a composition of an epoxy resin and polyether sulfon.

On the other hand, as the process of such a laminate, a novel process of producing a circuit substrate without using a conventional laminate has been put to practical use with recent miniaturization/lightweight of electronic instruments. For example, Japanese Patent Kokai (Laid-Open) No 7-147464 discloses a coefficient process of producing a printed circuit board of a high-density from a prepreg prepared by impregnating a nonwoven fabric of heat-resistant synthetic fibers with a thermosetting resin in the uncured state. If a complicated process which is carried out in a laminate manufacturer becomes unnecessary with the innovation of such a production procedure, a large rationalization can be expected. Therefore, the appearance of a lightweight prepreg having uniform formation, low linear thermal expansion coefficient and good mechanical strength is expected.

OBJECTS OF THE INVENTION

It is one objective of the present invention to provide a lightweight prepreg having uniform formation, low linear thermal expansion coefficient and good mechanical strength, comprising a porous para-oriented aromatic polyamide film and a thermoplastic resin and/or a thermosetting resin (hereinafter referred to as a "resin", sometimes), the porous para-oriented aromatic polyamide film being impregnated with the thermoplastic resin and/or thermosetting resin.

It is another objective of the present invention to provide a process producing the above prepreg.

It is further objective of the present invention to provide a printed circuit substrate/board using such a prepreg.

These objectives as well as other objectives and advantages of the present invention will become apparent to those skilled in the art from the following description.

SUMMARY OF THE INVENTION

The present invention relates to a prepreg comprising a porous para-oriented aromatic polyamide film and a thermoplastic resin and/or a thermosetting resin, the porous para-oriented aromatic polyamide film being impregnated with the thermoplastic resin and/or thermosetting resin. That is, the present invention relates to a prepreg comprising a porous para-oriented aromatic polyamide film and a thermoplastic resin or a thermosetting resin, the porous para-oriented aromatic polyamide film being impregnated with the thermoplastic resin or thermosetting resin, and a prepreg comprising a porous para-oriented aromatic polyamide film and a thermoplastic resin and a thermosetting resin, the porous para-oriented aromatic polyamide film being impregnated with the thermoplastic resin and thermosetting resin.

The present invention also relates to a prepreg comprising a porous para-oriented aromatic polyamide film is composed of fibrils having a diameter of not more than 1 $\mu$m and has a structure that the fibril is planarly arranged in the form of a network or a nonwoven fabric and laminated in the form of a layer, and a porous para-oriented aromatic polyamide film having a linear thermal expansion coefficient at 200° to 300° C. of ±50×10$^{-6}$/°C. and a percentage of vacant spaces of 30 to 95% is used.

The present invention further relates to a process for producing a prepreg comprising a porous para-oriented aromatic polyamide film and a thermoplastic resin and/or a thermosetting resin, the porous para-oriented aromatic polyamide film being impregnated with the thermoplastic resin and/or the thermosetting resin, which comprises the following steps (a) to (d):

step (a) of forming a film-like material from a solution containing 1 to 10% by weight of a para-oriented aromatic polyamide having an inherent viscosity of 1.0 to 2.8 dl/g and 1 to 10% by weight of a chloride of an alkaline metal or an alkaline earth metal in a polar amide solvent or a polar urea solvent;

step (b) of maintaining the film-like material at a temperature of not less than 20° C. or not more than −5° C. to deposit the para-oriented aromatic polyamide from the film-like material;

step (c) of immersing the film-like material obtained in the step (b) in an aqueous solution or an alcoholic solution to elute the solvent and the chloride of the alkaline metal or alkaline earth metal, followed by drying to obtain a porous para-oriented aromatic poly amide film; and step (d) of impregnating the porous film obtained in the step (c) as a substrate with the thermoplastic resin and/or thermosetting resin to produce a prepreg.

The present invention further relates to a printed circuit substrate, comprising the above prepregs. The present invention further relates to a printed circuit board, comprising an insulating layer of the above printed circuit substrate and a conductive layer of a metallic foil.

DETAILED DESCRIPTION OF THE INVENTION

The present invention will be explained in detail, hereinafter. In the present invention, the para-oriented aromatic polyamide is obtained by the condensation polymerization of a para-oriented aromatic diamine and a para-oriented aromatic dicarboxylic acid halide, substantially comprising a repeating unit wherein an amide bond is bonded at the para-position or similar orientation position (e.g. orientation position extending in the opposite direction (coaxial) or parallel, such as 4,4'-biphenylene, 1,5-naphthalene, 2,6-naphthalene, etc.) of the aromatic ring.

Specific examples thereof include para-aramid having a para-oriented structure or para-aramid having a structure similar to the para-oriented structure, such as poly (paraphenyleneterephthalamide), poly(parabenzamide), poly(4,4'-benzanilideterephthalamide), poly(paraphenylene-4,4'-biphenylenedicarboxylic acid amide), poly (paraphenylene-2,6-naphthalenedicarboxylic acid amide), poly(2-chloro-paraphenylene terephthalamide), copolymers of paraphenylenediamine/2,6-dichloroparaphenylenediamine/terephthalic acid chloride, etc.

The porous para-oriented aromatic polyamide film (hereinafter referred to as a "porous film", sometimes) of the present invention is a porous film obtained from the above para-oriented aromatic polyamide, and the film is composed of fibrils of a para-aramid and has the form of a network or a nonwoven fabric, observing microscopically. That is, the porous film of the present invention has a structure that fibrils having a diameter of not more than $1\mu$ are planarly arranged in the form of a network or a nonwoven fabric and laminated in the form of a layer. The phrase "planarly arranged" used herein means the fact that the fibrils are arranged on a parallel with the film surface. The porous film of the present invention is composed of fibrils and has a lot of vacant spaces. A percentage of vacant spaces is from 30 to 95%, preferably from 35 to 90%. When the percentage of vacant spaces is less than 30%, the film can not be said to be porous, substantially, and the impregnation amount of varnish prepared by dissolving the thermoplastic resin and/ or thermosetting resin in a solvent becomes insufficient.

On the other hand, when it exceeds 95%, the strength of the porous film becomes insufficient and, therefore, the handling becomes difficult. The porous film of the present invention has a linear thermal expansion coefficient at 200 to 300° C. (in the planar direction) within $\pm 50 \times 10^{-6}$/°C., preferably $\pm 25 \times 10^{-6}$/°C. Small linear thermal expansion coefficient shows good dimensional stability in the planar direction.

By the way, a meta-aramid paper known generally has a breaking length of 5 to 12 km. On the other hand, a para-aramid paper which has hitherto been known has a breaking length of about 0.1 km because agglutination between fibrils is not obtained like the meta-aramid and, therefore, it is not put to practical use. The porous film in the present invention comprises the para-aramid and is composed of fibrils of the para-aramid having a diameter of not more then $1\mu$. Therefore, the porous film has an excellent feature that the breaking length is the same as or larger than that of the meta-aramid paper in spite of it's microscopic nonwoven form.

The thermoplastic resin used in the present invention may be any resin having thermoplasticity and is not specifically limited, preferably a thermoplastic resin having a melting point of not less than 150° C. For the purpose of producing a printed circuit board which is considered as a main application of the prepreg of the present invention, those having sufficient adhesion properties to a material for forming an electronic circuit are preferred. Examples of such a thermoplastic resin include at least one thermoplastic resin selected from polyether sulfon, polysulfon, polyether imide, polysulfide sulfon, polycarbonate, polyimide, polyamide-imid and polyether ketone. These can be used alone or in combination thereof, appropriately.

On the other hand, the thermosetting resin used in the present invention is not specifically limited and examples thereof include at least one thermosetting resin selected from an epoxy resin, a bismaleimide-triazine resin, a polyimide resin, a diallyl phthalate resin, an unsaturated polyester resin, a cyanate resin and an allyl-modified polyphenylene ether resin. These can be used alone or in combination thereof, appropriately.

An amount of the thermoplastic resin or thermosetting resin (hereinafter referred to as a "resin", sometimes) added, that is, a weight ratio of the resin to the para-aramid is 1:9 to 7:3, preferably 2:8 to 6:4. When the weight ratio is less than 1:9, it is impossible to sufficiently fill vacant spaces of the porous film of the para-aramid with the resin. On the other hand, when the weight ratio exceeds 7:3, the linear thermal expansion coefficient of the prepreg becomes large and the resultant prepreg becomes unsuitable as the printed circuit board.

In the present invention, the thermoplastic resin and thermosetting resin can be respectively used alone, as described above, and can also be simultaneously used as a composition or separately used in the process of the prepreg. As described hereinafter, when using both thermoplastic resin and thermosetting resin, the resultant cured material is superior in toughness to that obtained when using them separately, and it is preferred in view of flexibility at the stage B.

An amount of the composition of the thermoplastic resin and thermosetting resin added, that is, a weight ratio of the composition to the para-aramid is 1:9 to 7:3, preferably 2:8 to 6:4, similar to that in case of the above resin. When the weight ratio is less than 1:9, it is impossible to sufficiently fill vacant spaces of the porous film of the para-aramid with the composition. On the other hand, when the weight ratio exceeds 7:3, the linear thermal expansion coefficient of the prepreg becomes large and the resultant prepreg becomes unsuitable as the printed circuit board. A ratio of the thermoplastic resin to the thermosetting resin formulated, that is, a weight ratio of the thermoplastic resin to the thermosetting resin is generally within the range from 7:3 to 3:7, as described hereinafter.

The prepreg of the present invention has a form that the porous film of the para-aramid is impregnated with the thermoplastic resin and/or thermosetting resin. More particularly, it has a form that vacant spaces are filled, that is, impregnated with the resin in the porous film having a structure that the fibrils of the para-aramid having a diameter of not more than 1 μm is planarly arranged in the form of a network or a nonwoven fabric and laminated in the form of a layer and the fibril is arranged on a parallel with the film surface. In such way, the form of the prepreg in the present invention is that the porous film in the form of the nonwoven fabric is impregnated with the resin and, therefore, the linear thermal expansion coefficient of the prepreg exclusively depend on the linear thermal expansion coefficient of the para-aramid porous film. As a result, the linear thermal expansion coefficient at 200° to 300° C. (in the planar direction) of the sheet obtained by curing the prepreg of the present invention becomes within $\pm 70 \times 10^{-6}/°C.$, preferably $\pm 35 \times 10^{-6}/°C$. Small linear thermal expansion coefficient shows good dimensional stability in the planar direction and is an optimum property as the printed circuit board.

As the form of the sheet obtained by curing the composition of the thermoplastic resin and thermosetting resin with heating in the present invention, a morphology that the thermoplastic resin forms the matrix part and the thermosetting resin forms the domain part is preferred. The cured material having this form has a feature of excellent toughness. The prepreg is normally subjected to processing for printed circuit substrate in the partially cured state (gel state or so-called "B-stage"). The thermosetting resin does not sufficiently show the strength and is brittle in the B-stage and the composition of the present invention has flexibility even in the B-stage and, therefore, it has an advantage that the handling becomes easy in the step of producing the printed circuit substrate.

It is preferred that the ratio of the thermoplastic resin to the thermosetting resin formulated is a ratio at which the cured material has the above morphology. Since this ratio depends on the kind and combination of the thermoplastic resin and thermosetting resin, the ratio is not easily limited to a specific numeral value. The weight ratio of the thermoplastic resin to the thermosetting resin is generally within the range from 7:3 to 3:7. When the weight ratio exceeds 7:3, a difference between a system of the present invention and a system using only the thermoplastic resin as a matrix is lost and the use of the thermosetting resin does not mean anything. Although an improvement in adhesion between a copper foil as the conductive layer of the printed circuit substrate and the prepreg is expected as a merit of the use of the thermosetting resin, and this effect is decreased. On the other hand, when the weight ratio is less than 3:7, the matrix part becomes the thermosetting resin and the toughness of the cured material and flexibility at the B-stage can not be obtained.

A thickness of the prepreg produced by the process of the present invention can be reduced. However, when the thickness of the film is less than 10 μm, wrinkles are liable to be formed and the handling is difficult. Specifically, the thickness of the para-amide film is preferably from 10 to 150 μm, more preferably from 30 to 100 μm. The upper limit is not specifically limited but when the thickness exceeds 150 μm, an important feature of the board (e.g. lightweight and thinness) is lost.

The embodiments of the process for producing the prepreg of the present invention will be explained in detail, hereinafter. These embodiments are considered in all respects as illustrative and not restrictive. The typical embodiments of the process for producing the prepreg of the present invention include the following steps (a) to (d):

step (a) of forming a film-like material from a solution containing 1 to 10% by weight of a para-oriented aromatic polyamide having an inherent viscosity of 1.0 to 2.8 dl/g and 1 to 10% by weight of a chloride of an alkaline metal or an alkaline earth metal in a polar amide solvent or a polar urea solvent;

step (b) of maintaining the film-like material at a temperature of not less than 20° C. or not more than −5° C. to deposit the para-oriented aromatic polyamide from the film-like material;

step (c) of immersing the film-like material obtained in the step (b) in an aqueous solution or an alcoholic solution to elute the solvent and the chloride of the alkaline metal or alkaline earth metal, followed by drying to obtain a porous para-oriented aromatic poly amide film; and step (d) of impregnating the porous film obtained in the step (c) as a substrate with the thermoplastic resin and/or thermosetting resin to produce a prepreg.

The para-aramid solution used in the step (a) can be suitably produced by the operation described below. That is, the para-aramid solution wherein a para-aramid concentration is from 1 to 10% by weight is prepared by adding 0.94 to 0.99 mol of a para-oriented aromatic dicarboxylic acid dihalide per 1.0 mol of a para-oriented aromatic diamine in a polar amide solvent or a polar urea solvent wherein 1 to 10% by weight of a chloride of an alkaline metal or an alkaline earth metal is dissolved, followed by condensation polymerization at a temperature of −20° to 50° C.

An amount of the chloride of the alkaline metal or alkaline earth metal in the para-aramid solution is from 1 to 10% by weight, preferably from 2 to 8% by weight. Normally, when the amount of the chloride of the alkaline metal or alkaline earth metal is less than 1%, the solubility of the para-aramid is insufficient. On the other hand, when it exceeds 10% by weight, the chloride of the alkaline metal or alkaline earth metal does not dissolve in the polar amide solvent or polar urea solvent. More precisely, the amount of the chloride of the alkaline metal or alkaline earth metal in the para-aramid solution is decided based on an amount of the para-aramid (amide group in the para-aramid). That is, the amount of the above chloride added to the polymerization system is preferably from 0.5 to 6.0 mol, more preferably from 1.0 to 4.0 mol, per 1.0 mol of the amide group formed by condensation polymerization. When the amount of the chloride is less than 0.5 mol, the solubility of the formed para-aramid becomes insufficient. On the other hand, when it exceeds 6.0 mol, it substantially exceed an amount of the chloride which can dissolve in the solvent, and it is not preferred.

A para-aramid concentration in the para-aramid solution is from 1 to 10% by weight, preferably from 2 to 8% by weight. When the para-aramid concentration is less than 1% by weight, the productivity is drastically lowered, thereby causing an industrial disadvantage. On the other hand, when the para-aramid concentration exceeds 10% by weight, a stable para-aramid solution can not be obtained because the para-aramid deposits.

The para-aramid in the step (a) is a para-aramid which shows a value of an inherent viscosity (inherent viscosity in the present invention is as defined below) within the range from 1.0 to 2.8 dl/g, preferably from 1.5 to 2.6. When the inherent viscosity is less than 1.0 dl/g, a sufficient film strength can not be obtained. On the other hand, when the inherent viscosity exceeds 2.5 dl/g, a stable para-aramid solution is not easily obtained and, therefore, it becomes difficult to form a film because of the para-aramid deposits.

Examples of the para-oriented aromatic diamine used for condensation polymerization of the para-aramid in the step (a) include paraphenylenediamine, 4,4'-diaminobiphenyl, 2-methyl-paraphenylenediamine, 2-chloro-paraphenylenediamine, 2,6-dichloro-paraphenylenediamine, 2,6-naphthalenediamine, 1,5-naphthalenediamine, 4,4'-diaminobenzanilide, 3,4'-diaminodiphenyl ether, etc. One or two sorts of the para-oriented aromatic diamines can be applied for condensation polymerization.

Examples of the para-oriented aromatic dicarboxylic acid halide used for condensation polymerization of the para-aramid in the step (a) include terephthalic acid dichloride., biphenyl-4,4'-dicarboxylic acid chloride, 2-chloroterephthalic acid dichloride, 2,5-dichloroterephthalic acid dichloride, 2-methylterephthalic acid dichloride, 2,6-naphthalenedicarboxylic acid chloride, 1,5-naphthalenedicarboxylic acid chloride, etc. One or two sorts of the para-oriented aromatic dicarboxylic acid halides can be applied for condensation polymerization.

The condensation polymerization of the para-aramid in the step (a) is conducted in the polar amide solvent or polar urea solvent. Examples of the solvent include N,N-dimethylformamide, N,N-dimethylacetamide, N-methyl-2-pyrrolidone, N,N,N',N'-tetramethylurea, etc. Among them, N-methyl-2-pyrrolidone is particularly preferred, but the solvent is not limited thereto.

In the step (a), the chloride of the alkaline metal or alkaline earth metal is suitably used for the purpose of improving the solubility of the para-aramid in the solvent. Specific examples thereof include lithium chloride and calcium chloride, but the metal is not limited thereto.

An amount of the above chloride added to the polymerization system is preferably within the range from 0.5 to 6.0 mol, more preferably from 1.0 to 4.0 mol, per 1.0 mol of the amide group formed by the condensation polymerization as described above.

In the step (a), the process of forming the film-like material from the solution is not specifically limited. For example, the film-like material can be formed by casting the solution on a substrate such as glass plate. It is also possible to form the film-like material by controlling the amount of the solution using a bar coater so that the thickness of the solution on the substrate such as glass plate becomes the objective thickness.

In the step (b), a para-aramid is deposited after forming in the form of a film(film-like material) from a para-aramid solution in the step (a), before coagulation.

The process of the present invention has an excellent feature in that a porous film is produced by forming a film-like material from a para-aramid solution, and depositing a para-aramid before coagulation. According to this process, the finally obtained porous film can have an uniform structure in the thickness direction. In the process, the film is maintained at a temperature of not less than 20° C. or not more than −5° C. for a given time (hereinafter referred to as a "high-temperature deposition process" or a "low-temperature deposition process", respectively). The form factor of the finally obtained porous film (e.g. percentage of vacant spaces, diameter of fibrils, etc.) can also be controlled by the deposition temperature and maintenance time.

Besides, the film-like material obtained in the step (a) can be immersed directly in a coagulating solution without the step (b), and a porous para-aramid is coagulated and deposited. (Hereinafter referred to as a "coagulating deposition process")

The coagulating solution usable here does not dissolve a para-aramid and is miscible with a polar amide solvent or a polar urea solvent. As the coagulating solution, aqueous or alcoholic solution such as water or methanol is used, specifically. However, the coagulating deposition process is inferior in the uniformity of the thickness direction compared with the high temperature deposition process and the low temperature deposition process.

The high-temperature deposition process will be explained. In order to produce a porous film by the high-temperature deposition process, a para-aramid solution is maintained at a temperature of not less than 20° C., preferably not less than 30° C., for a given time to deposit a para-aramid.

The time at which the para-aramid begins to deposit depends on the composition of the para-aramid solution (e.g. amount of chloride, para-aramid concentration, amount of water etc.) and temperature maintained and, therefore, it is not specifically limited.

For example, when the para-aramid concentration is 6% by weight and an amount of calcium chloride is the same mol as that of the amide group, the para-aramid solution is stable at 20° C. for one week or more and causes no deposition but the para-aramid deposits at 60° C. in about 5 minutes. When the para-aramid concentration is 6% by weight and the amount of calcium chloride is 0.7 mol per one mol of the amide group, the para-aramid deposits at 20° C. after about half a day and deposits at 30° C. after about one hour. It is preferred to control the humidity, in addition to the deposition temperature, so as to advance the deposition time. In this case, it is particularly preferred to adjust the humidity (relative humidity) to 40 to 100%.

As described above, the higher the temperature, the shorter the time at which the para-aramid begins to deposit maybe. Since the form factor (e.g. percentage of vacant spaces of porous film, diameter of fibrils, etc.) depends on the deposition temperature, the deposition temperature is decided by a synthetic judgment according to the purpose.

Next, the low-temperature deposition process will be explained. In order to produce a porous film by the low-temperature deposition process, a para-aramid solution is maintained at a temperature of not more than −5° C., preferably not more than −10° C., for a given time to deposit a para-aramid, thereby obtaining a film.

The time at which the para-aramid begins to deposit depends on the composition of the para-aramid solution (e.g. amount of chloride, para-aramid concentration, amount of water etc.) and temperature maintained and, therefore, it is not specifically limited.

For example, when the para-aramid concentration is 6% by weight and an amount of calcium chloride is the same mol as that of the amide group, the para-aramid solution is stable at −5° C. for one week or more and causes no deposition but the para-aramid deposits at −20° C. in about 30 minutes. When the para-aramid concentration is 6% by weight and the amount of calcium chloride is 0.7 mol per one mol of the amide group, the para-aramid deposits at −5° C. after about half a day and deposits at −10° C. after about one hour.

As described above, the lower the temperature, the shorter the time at which the para-aramid begins to deposit may be. Since the form factor (e.g. percentage of vacant spaces of porous film, diameter of fibrils, etc.) depends on the deposition temperature, the deposition temperature is decided by a synthetic judgment according to the purpose.

In the step (c), the solvent and chloride of the alkaline metal or alkaline earth metal are removed from the film-like material obtained in the step (b). As the removal process, for example, there is a process of immersing the film-like material in a solution to elute the solvent and chloride. When the solvent is removed from the film-like material by evaporation, there can also used a process of immersing again in a solution such as water to elute the chloride. As the solution used for eluting the solvent or chloride, an aqueous solution or an alcoholic solution is preferred because the solvent and chloride can be dissolved. As the aqueous solution, water may be used.

The film-like material wherein the solvent and chloride have been removed is dried to produce the objective porous film. The drying process is not specifically limited, and known various processes can be used. The term "film-like material" used herein means an intermediate form before it becomes the porous film as the final product.

In the step (d), the process of impregnating the porous film with the thermoplastic resin and/or thermosetting resin is not specifically limited and there can be applied a process of impregnating the thermosetting resin with a paper or a glass cloth, which has hitherto been known. For example, a prepreg can be produced by preparing a varnish wherein the composition of the thermoplastic resin and thermosetting resin is dissolved in a solvent, applying the varnish to the porous film to impregnate it with the varnish and evaporating the solvent.

In the prepreg using only the thermoplastic resin as the resin and the prepreg using the thermoplastic resin and thermosetting resin as the resin, all or a part of the thermoplastic resin can be added to the above step (a). That is, the prepreg can be obtained via the following steps (a') to (d'):

step (a') of forming a film-like material from a solution containing 1 to 10% by weight of a para-oriented aromatic polyamide having an inherent viscosity of 1.0 to 2.8 dl/g, 1 to 10% by weight of a chloride of an alkaline metal or an alkaline earth metal and a thermoplastic resin in a weight ratio of the thermoplastic resin to the para-oriented aromatic polyamide of 1:9 to 7:3 in a polar amide solvent or a polar urea solvent;

step (b') of maintaining the film-like material at a temperature of not less than 20° C. or not more than −5° C. to exclusively deposit the para-oriented aromatic polyamide, thereby obtaining a film-like material of a porous para-oriented aromatic polyamide swelled with the solution containing the thermoplastic resin solution;

step (c') of immersing the film-like material of the porous para-oriented aromatic polyamide in an aqueous solution or an alcoholic solution, coagulating it to obtain a film-like material wherein the thermoplastic resin is deposited in the inside of the porous film-like material, eluting the solvent and the chloride and drying the resultant film-like material to obtain a prepreg wherein the porous para-oriented aromatic polyamide is impregnated with the thermoplastic resin; and a step (d') of optionally impregnating the porous film obtained in the step (c) as a substrate with the thermoplastic resin and/or thermosetting resin to produce a prepreg.

In the steps (a') to (d'), operations which are the substantially same as those of the above steps (a) to (d) are conducted. In case of the prepreg obtained by impregnating only with the thermoplastic resin, the thermoplastic resin has already been added in the step (a') and, therefore, a prepreg impregnated with the thermoplastic resin as a final object can be easily obtained by drying the film-like material obtained in the step (c'). On the other hand, it is requested to increase the impregnation amount of the thermoplastic resin or to impregnate with the thermosetting resin, there can be added the step of optionally impregnating the porous film obtained in the step (c) as a substrate with the thermoplastic resin and/or thermosetting resin to produce a prepreg (step (d')), similar to the step (d).

In the step (a'), the para-aramid solution is mixed with the thermoplastic resin so that the weight ratio of the thermoplastic resin to the para-oriented aromatic polyamide becomes 1:9 to 7:3 to form a film-like material of the solution.

The above prepreg can be suitably used as the printed circuit board because of low linear thermal expansion coefficient, excellent mechanical strength and adhesion properties with the metallic foil. Such a printed circuit board can be made by the process which is generally conducted (e.g. "All of Printed-Wiring Substrate", Electronic Technique, 1986th edition, separate volume). That is, the printed circuit board is made by using the prepreg of the present invention as an insulating layer and laminating it with a conductive layer of a metallic foil. As a metal for the metallic foil, there can be used gold, silver, copper, nickel, aluminum, etc.

The prepreg of the present invention has excellent characteristics such as lightweight and low linear thermal expansion coefficient of the porous para-oriented aromatic polyamide film, good mechanical properties and characteristics (e.g. uniform formation, etc.) which can not be obtained in case of using a nonwoven fabric. Particularly, there is provided a prepreg which is useful as a printed circuit board by impregnating the porous aramid film with a resin composition, as a matrix resin, comprising a thermoplastic resin and a thermosetting resin, which have good heat resistance, adhesion properties and toughness.

The following Examples and Comparative Examples further illustrate the present invention in detail but are not to be construed to limit the scope thereof. The test and evaluation methods as well as criteria in the Examples and Comparative Examples are as shown below.

(1) Inherent viscosity

A flow time of a solution prepared by dissolving 0.5 g of a para-aramid polymer in 100 ml of 96–98% sulfuric acid and 96–98% sulfuric acid were measured, respectively, using a capillary viscometer at 30° C. Then, the inherent viscosity was determined from a ratio of the resultant flow times according to the following equation:

$$\text{Inherent viscosity} = \ln(T/T_0)/C \text{ [unit: dl/g]}$$

wherein T and $T_0$ respectively indicate a flow time of a para-aramid-sulfuric acid solution and that of sulfuric acid, and C is a para-aramid concentration (dl/g) in a para-aramid-sulfuric acid solution.

(2) Percentage of vacant spaces

A film was cut into pieces of a square shape (length of side: L cm), and then a weight (W g) and a thickness (D cm) were measured. Assuming that a true specific gravity of the para-aramid is 1.45 g/cm$^3$, a percentage of vacant spaces (volume %) was determined by the following equation:

$$\text{Percentage of vacant spaces (volume \%)} = 100 - 100 \times (W/1.45)/(L^2 \times D)$$

(3) Tensile test

A specimen was punched from the porous film, prepreg or cured sheet obtained by curing the prepreg, respectively, using a dumbbell cutter manufactured by Dumbbell Co., and then a tensile strength was determined using an Instron type universal tensile tester (model 4301, manufactured by Instron Japan Co.) according to JIS K-7127.

(4) Peeling strength of copper foil

It was measured according to JIS C-6481.

(5) Linear thermal expansion coefficient

A specimen was thermally analyzed using a thermal analyzing device TMA 120 manufactured by Seiko Denshi Co., Ltd. according to ASTM-D696, and a linear thermal expansion coefficient was calculated by the following equation:

$$\alpha 1 = \Delta L / L_0 \cdot \Delta T$$

wherein

α1: linear thermal expansion coefficient (/°C.)
ΔL: changed length of specimen
$L_0$: length of specimen before testing
ΔT: difference in temperature (°C.)

(6) Dielectric constant

It was measured using a multi frequency meter 4275A manufactured by Yokogawa Hulet Packard Co., Ltd according to JIS C-6481. A sheet made by curing a prepreg, obtained by impregnating the porous film with the thermosetting resin, was cut into pieces of 10 mm square and gold was vacuum-deposited on the both surfaces, and the resultant was used as a specimen.

(7) Water absorption

A sheet obtained by cutting the prepreg into pieces of 70 mm square, followed by curing was used as a specimen. After the specimen was dried at 120° C. for 2 hours and allowed to stand under the condition of 25° C. and a relative humidity of 65% for 24 hours, a change in weight was measured.

EXAMPLE 1

(1) Polymerization of poly(paraphenylene-terephthalamide)

Using a 5 liter separable flask equipped with a stirring blade, a thermometer, nitrogen introducing tube and a powder adding inlet, poly(paraphenyleneterephthalamide) (hereinafter abbreviated to "PPTA") was polymerized. After the flask was sufficiently dried, 4200 g of N-methyl-2-pyrrolidone (hereinafter abbreviated to "NMP") was charged and 272.2 g of calcium chloride dried at 200° C. for 2 hours was added, followed by heating to 100° C. After calcium chloride was completely dissolved, the temperature was returned to room temperature. Then, 132.9 g of paraphenylenediamine (hereinafter referred to as "PPD") was added and completely dissolved. While maintaining the resultant solution at 20 ±2° C., 243.3 g of terephthaloyl dichloride (hereinafter abbreviated to "TPC") was added every 5 minutes in ten portions. The solution was aged for one hour while maintaining at 20 ±2° C., and then stirred under reduced pressure for 30 minutes to remove bubbles. The resultant polymer solution (polymer dope) showed an optical anisotropy. Aliquot of the polymer solution was taken as a sample and reprecipitated in water to give a polymer. An inherent viscosity of the resultant PPTA was measured and, as a result, it was 1.96 d/g.

(2) A percentage of vacant spaces and linear thermal exprasion coefficient of PPTA film A porous film of PPTA was made from the polymer solution of the above item (1). That is, the polymer solution (100 g) of the item (1) was weighed and charged in a 500 ml separable flask equipped with a stirring blade, a thermometer, a nitrogen introducing tube and a powder adding inlet, and then diluted with NMP (150 g). The resultant solution had a PPTA concentration of 2.4% by weight and calcium chloride of 2 mol per 1 mol of the amide group of PPTA. Then, a film-like material of the solution was made on a glass plate using a bar coater (film thickness: 0.8 mm) manufactured by Tester Sangyo Co., Ltd. and immediately maintained in a heating oven at 80° C. for about 20 minutes. During heating, PPTA was deposited to form a porous film-like material. This film-like material was immersed in deionized water. Three minutes after immersing, the porous film-like material was separated from the glass plate. This porous film-like material was sufficiently washed while flowing deionized water, taken out from water and then free water was wiped off. This porous film-like material was sandwiched between filter papers and then sandwiched between glass cloths. The film-like material was placed on an aluminum plate in a state of being sandwiched between filter papers and glass cloths, and coated with a nylon film. Then, the nylon film and aluminum plate were sealed with a gum and a conduit for vacuum was attached thereto. The whole was put in a heating oven and the porous film-like material was dried at 120° C. while evacuating. The resultant porous film had a thickness of 32 μm and a percentage of vacant spaces of 60%. A linear thermal expansion coefficient at 200° to 300° C. was −6.5× $10^{-6}$/°C.

(3) Preparation of polyether sulfon solution

Polyether sulfon (Sumika Excell PES3600 manufactured by Sumitomo Chemical Industries Co., Ltd., hereinafter referred to as "PES") (60 g) was weighed and charged in a 500 ml separable flask equipped with a stirring blade and a liquid adding inlet, and NMP (260 g) was added. When the mixture was stirred at room temperature, it was perfectly dissolved to turn into a pale yellow liquid. Hereinafter, this liquid is referred to as "PES solution".

(4) Preparation of solution for prepreg

The polymer solution (200 g) of the above item (1) and PES solution (40 g) of the above item (3) were weighed and charged in a 500 ml separable flask equipped with a stirring blade, a nitrogen introducing tube and a liquid adding inlet, and NMP (285 g) was gradually added. Finally, a solution having a PPTA concentration of 2.3% by weight and a PES concentration of 1.5% by weight was prepared. This solution is referred to as an "A solution".

(5) Preparation of prepreg

A film-like material of the solution A was made on a glass plate using a bar coater (film thickness: 0.8 mm) manufactured by Tester Sangyo Co., Ltd. and immediately maintained in a heating oven at 80° C. for about 20 minutes. During heating, PPTA was deposited and a pale yellow turbidity was formed in the film-like material. This film-like material was immersed in deionized water to obtain a film-like material wherein PES was solidified. Three minutes after immersing, the film-like material was separated from the glass plate. This film-like material was sufficiently washed while flowing deionized water, taken out from water and then free water was wiped off. This film-like material was immersed in an aqueous 20 wt % NMP solution and, after treating in an ultrasonic washer, free water was wiped off. This film-like material was sandwiched between filter papers and then sandwiched between glass cloths. The film-like material was placed on an aluminum plate in the state of being sandwiched between filter papers and glass cloths, and covered with a nylon film. Then, the nylon film and aluminum plate were sealed with a gum and a conduit for vacuum was attached thereto. The whole was put in a heating oven and the film-like material was dried at 120° C. while evacuating to obtain a prepreg.

The resultant prepreg was a lightweight prepreg having uniform formation and a thickness of 31 μm.

The resultant prepreg was observed by a scanning electron microscope. As a result, it has been found that fibril-like PPTA of the para-aramid was uniformly dispersed and spread in the form of a net. The thermoplastic resin filled almost all of vacant spaces to coat the fibrils. A linear thermal expansion coefficient of this prepreg was measured. As a result, it was $7.95 \times 10^{-6}/°C$. and $22.8 \times 10^{-6}/°C$. within the range from 100° to 200° C. and that from 200° to 300° C., respectively. This prepreg had properties suitable as the circuit substrate or circuit laminate using the same.

EXAMPLE 2

(1) Preparation of solution for prepreg

The polymer solution (100 g) of Example 1 and PES solution (20 g) of Example 1 were weighed and charged in a 500 ml separable flask equipped with a stirring blade, a nitrogen introducing tube and a liquid adding inlet, and NMP (67 g) was gradually added. Finally, a solution having a PPTA concentration of 3.2% by weight and a PES concentration of 2.2% by weight was prepared. This solution is referred to as a "B solution".

(2) Production of prepreg

According to the same manner as that described in Example 1, a prepreg was produced from the B solution. A thickness was 55 μm.

(3) Lamination of copper foil and prepreg

The prepreg produced in the above item (2) was sandwiched between copper foils having a thickness of 35 μm, followed by a hot-press calendering processing using a portable rolling mill manufactured by Daito Seisakusho Co., Ltd. An adhesion between the prepreg and copper foil was 0.55 kg/cm.

EXAMPLE 3

(1) Preparation of solution for prepreg

The polymer solution (100 g) of Example 1 and PES solution (300 g) of Example 1 were weighed and charged in a 500 ml separable flask equipped with a stirring blade, a nitrogen introducing tube and a liquid adding inlet, and NMP (70 g) was gradually added. Finally, a solution having a PPTA concentration of 3.0% by weight and a PES concentration of 3.0% by weight was prepared. This solution is referred to as a "C solution".

(2) Production of prepreg

According to the same manner as that described in Example 1, a prepreg was prepared from the C solution. A thickness was 72 μm.

(3) Lamination of copper foil and prepreg

The prepreg produced in the above item (2) was sandwiched between copper foils having a thickness of 35 μm, followed by a hot-press calendering processing using a portable rolling mill manufactured by Daito Seisakusho Co., Ltd. An adhesion between the prepreg and copper foil was 0.73 kg/cm.

EXAMPLE 4

A solution having a PPTA concentration of 2.6% by weight and a PES concentration of 0.7% by weight was prepared from the polymer solution and PES solution of Example 1. According to the same manner as that described in Example 1, a prepreg was produced. This prepreg had a thickness of 24 μm, a tensile strength of 9.3 kg/mm² and an elongation of 7.3%.

EXAMPLE 5

(1) Preparation of solution for prepreg

The polymer solution (100 g) and PES solution (20 g) of Example 1 were weighed and charged in a 500 ml separable flask equipped with a stirring blade, a nitrogen introducing tube and a liquid adding inlet, and NMP (66 g) was gradually added. Finally, a solution having a PPTA concentration of 3.2% by weight and a PES concentration of 2.2% by weight was prepared. This solution is referred to as a "D solution".

(2) Production of prepreg

A film-like material of the D solution was made on a glass plate using a bar coater (film thickness: 0.8 mm). This film-like material was immersed in deionized water to simultaneously solidify PPTA and PES. Five minutes after immersing, the resultant film-like material was separated from the glass plate. This film-like material was sufficiently washed while flowing deionized water, taken out from water and then free water was wiped off. This film-like material was immersed in an aqueous 20 wt % NMP solution and, after treating in an ultrasonic washer, free water was wiped off. This film-like material was sandwiched between filter papers and then sandwiched between glass cloths. The film-like material was placed on an aluminum plate in a state of being sandwiched between filter papers and glass cloths, and covered with a nylon film. Then, the nylon film and aluminum plate were sealed with a gum and a conduit for vacuum was attached thereto. The whole was put in a heating oven and the film-like material was dried at 120° C. while evacuating to obtain a prepreg. The resultant prepreg was opaque and had a thickness of 65 μm.

Example 6

(1) Preparation of PPTA solution

The polymer solution (100 g) of Example 1 was weighed and charged in a 500 ml separable flask equipped with a stirring blade, a nitrogen introducing tube and a liquid adding inlet, and NMP was gradually added. Finally, a solution having a PPTA concentration of 3.0% by weight was prepared. This solution is referred to as a "solution E".

The E solution was diluted with NMP to prepare a PPTA solution having a PPTA concentration of 2.0% by weight, which was referred to as a "F solution".

(2) Preparation of PPTA porous film (E)

The E solution was formed in the form of the film on a glass plate using a bar coater (film thickness: 0.35 mm) manufactured by Tester Sangyo Co., Ltd. and immediately maintained in a heating oven at 60° C. for about 20 minutes. As a result, PPTA was deposited to obtain a film wherein a white turbidity is formed.

This film-like material was immersed in deionized water. Few minutes after immersing, the film was separated from the glass plate. This film was immersed while flowing deionized water for about 1 hour. This film was taken out from water and then free water was wiped off. This film was sandwiched between filter papers and then sandwiched between glass cloths. The film-like material was placed on an aluminum plate in a state of being sandwiched between filter papers and glass cloths, and coated with a nylon film. Then, the nylon film and aluminum plate were sealed with a gum and a conduit for vacuum was attached thereto. The whole was put in a heating oven and the film-like material was dried at 120° C. while evacuating.

The film obtained after drying had uniform formation, a thickness of 14 μm and a percentage of vacant spaces of 46%. The film was observed by a scanning electron microscope. As a result, it has been found that fibril-like PPTA of a diameter of not more than about 0.1 μm was uniformly dispersed and spread in the form of a net, and the film was a porous film wherein vacant spaces of 0.05 to 0.2 μm are uniformly dispersed over the film.

A tensile strength and a linear thermal expansion coefficient of the resultant porous film were measured. As a result, the tensile strength in the application direction was 9.0 kg/mm² and the elongation was 6.7% and, further the linear thermal expansion coefficient was $-6.2 \times 10^{-6}/°C$. The tensile strength in the direction perpendicular to the application direction was 8.8 kg/mm$^2$ and the elongation was 6.3% and, further the linear thermal expansion coefficient was $-6.5 \times 10^{-6}$/°C.

(3) Production of prepreg and printed circuit substrate/board (i) Preparation of varnish To a mixture of the following composition was added a solvent (methyl ethyl ketone, hereinafter abbreviated to "MEK") and the mixed solution was heated at ref lux while stirring with a magnetic stirrer in a 300 ml Erlenmeyer flask equipped with a reflux tube to obtain a varnish.

Formulation composition of varnish

|  | (Parts by weight) |
|---|---|
| Chief agent: Sumiepoxy LDX-4120 (manufactured by Sumitomo Chemical Industries Co., Ltd.) | 100.0 |
| Curing agent: dicyandiamide (DICY, manufactured by Tokyo Kasei Co., Ltd.) | 2.7 |
| Catalyst: 2-methyl-4-ethylimidazole (manufactured by Shikoku Kasei Co., Ltd.) | 0.2 |

(2) Production of prepreg

A porous film was cut into pieces of 100 mm square and the varnish prepared in the item (1) was applied on both surfaces of the porous film. During impregnating with the varnish, the porous film was sandwiched between a fluorine film (trade name: Toyoflon 50F, manufactured by Toray Co., Ltd.) so that the solvent is not evaporated and the varnish was uniformly spread by holding down the fluorine film. After allowing to stand for 10 minutes, the porous film was uniformly impregnated with the varnish and transferred on a glass cloth (product number: YES-2101, manufactured by Nihon Itagarasu Seni Co., Ltd.). Then, the solvent was removed by heating at 150° C. for 3 minutes and the epoxy resin was semi-cured to produce a prepreg.

(3) Production of printed circuit substrate

The prepreg was cut into pieces of 40 mm square and 12 pieces were laminated each other, and then pressed at 170° C. under pressure of 10 kg/cm$^2$ for 2 hours. Then, the epoxy resin was perfectly cured to produce a printed circuit substrate having a thickness of 0.34 mm.

The resultant printed circuit substrate had a dielectric constant of 3.8 (1 MHz) and a linear thermal expansion coefficient in the direction of the thickness (Z) within the temperature range from 100° to 200° C. of $5.51 \times 10^{-5}$/°C. The thermal expansion coefficient was measured by using an expansion/compression type probe under the measuring condition of a press load of 1 kg/cm$^2$, a heating rate of 10° C./minute and a temperature range from 25° to 300° C.

(4) Production of printed circuit board

The prepreg was cut into pieces of 40 mm square and 12 pieces were laminated each other. Then, a copper foil (TTAI treatment, 35 μm in thickness, manufactured by Furukawa Circuit Foil Co., Ltd.) was laminated thereon and pressed at 170° C. under pressure of 10 kg/cm$^2$ for 2 hours. Then, the epoxy resin was perfectly cured to produce a printed circuit substrate having a thickness of 0.37 mm. A peeling strength of the foil from the substrate was 1.3 kg/cm.

EXAMPLE 7

(1) Production of PPTA porous film (F)

The F solution of Example 6 was formed in the form of the film on a glass plate using a bar coater (film thickness: 2.5 mm) manufactured by Tester Sangyo Co., Ltd. and immediately maintained in a heating oven at 60° C. for about 20 minutes. As a result, PPTA was deposited to obtain a film wherein a white turbidity is formed.

This film was immersed in deionized water. Few minutes after immersing, the film was separated from the glass plate. This film was immersed while flowing deionized water for about 1 hour. This film was taken out from water and then free water was wiped off. This film was sandwiched between filter papers and then sandwiched between glass cloths. The film-like material was placed on an aluminum plate in a state of being sandwiched between filter papers and glass cloths, and coated with a nylon film. Then, the nylon film and aluminum plate were sealed with a gum and a conduit for vacuum was attached thereto. The whole was put in a heating oven and the film-like material was dried at 120° C. while evacuating.

The film obtained after drying had a thickness of 66 μm and a percentage of vacant spaces of 43%. The film was observed by a scanning electron microscope. As a result, it has been found to be a porous film comprising fibril-like PPTA fibers having a diameter of not more than about 0.1 μm and having vacant spaces of 0.05 to 0.2 μm.

(2) Production of prepreg and printed circuit substrate/board

According to the same manner as that described in Example 6, a prepreg impregnated with an epoxy resin, a printed circuit substrate and a printed circuit board using the same as the insulating layer were produced.

EXAMPLE 8

(1) Production of PPTA porous film (G)

The F solution of Example 6 was formed in the form of the film on a glass plate using a bar coater (film thickness: 2.5 mm) manufactured by Tester Sangyo Co., Ltd. and immediately maintained in a heating oven at 80° C. for about 20 minutes. As a result, PPTA was deposited to obtain a film wherein a white turbidity is formed.

This film was immersed in deionized water. Few minutes after immersing, the film was separated from the glass plate. This film was immersed while flowing deionized water for 1 hour. This film was taken out from water and then free water was wiped off. This film was sandwiched between filter papers and then sandwiched between glass cloths. The film-like material was placed on an aluminum plate in a state of being sandwiched between filter papers and glass cloths, and coated with a nylon film. Then, the nylon film and aluminum plate were sealed with a gum and a conduit for vacuum was attached thereto. The whole was put in a heating oven and the film-like material was dried at 120° C. while evacuating.

The resultant film was a porous film of a fibril-like PPTA fiber having a thickness of 58.8 μm and a percentage of vacant spaces of 36.9%.

This porous film (G) was sandwiched between two glass plates having a thickness of 0.5 mm and then heat-treated in a heating oven at 300° C. in a heating oven under a nitrogen atmosphere for 30 minutes after heating from 25° to 300° C. The linearthermal expansion coefficient of the planer direction (X or Y) of the film after heat treatment was measured. In case of measuring, a tension type probe was used. Heating and cooling of the same sample was repeated three times under the measuring condition of a load of 2 g, a heating rate of 2 g and a temperature range of heating of 25° to 35° C., and a change in length of the sample was measured to determine the linear thermal expansion coefficient in the low-temperature range (25° to 70° C.) and high-temperature range (200° to 300° C.). Zero adjustment was conducted only when the sample was firstly set, and zero adjustment was not conducted during the following heating and cooling. It was previously confirmed that there is no significant difference in linear thermal expansion coefficient between the X direction and Y direction.

The measuring results are shown in Table 1. As is apparent from the measuring results described in Table 1, the porous film (G) heat-treated at 300° C. shows a low linear thermal expansion coefficient. It has been found that the porous film shows a particularly low linear thermal expansion coefficient and is superior in dimensional stability in the high-temperature range. As is apparent from these results, it is expected that the printed circuit substrate made from the para-aramid porous film and printed circuit board practically exhibit an excellent performance in the soldering reflow test at 260° C.

TABLE 1

Linear thermal expansion coefficient

Linear thermal expansion coefficient ($\times 10^{-6}$/°C.)
(Numeral in the parentheses represents the measuring temperature range: °C.)

| | | |
|---|---|---|
| 1st time | 23.1 (40~70), | −6.5 (200~300) |
| 2nd time | 33.7 (25~50), | −6.3 (200~300) |
| 3rd time | 33.6 (25~50), | −6.4 (200~300) |

(2) Production of prepreg and printed circuit substrate/board

According to the same manner as that described in Example 6, a prepreg impregnated with an epoxy resin, a printed circuit substrate and a printed circuit board using the same as the insulating layer were produced using the para-aramid porous film thus obtained. A peeling strength of the cupper foil from the substrate was 1.2 kg/cm.

EXAMPLE 9

(1) Preparation of epoxy composition

Sumiepoxy ESB-500 (90 g, manufactured by Sumitomo Chemical Industries Co., Ltd.), Sumiepoxy ESCN-195-6 (10 g, manufactured by Sumitomo Chemical Industries Co., Ltd.), a 10 wt % methyl cellosolve (25 g) solution of dicyandiamide (manufactured by Tokyo Kasei Co., Ltd.) and a methyl ethyl ketone (1.0 g, hereinafter abbreviated to "MEK") solution of 2-methyl-4-ethylimidazole (manufactured by Shikoku Kasei Co., Ltd.) were charged in a 300 ml Erlenmeyer flask equipped with a flux tube. A solvent for dilution, MEK was further added and the mixture was adjusted so that the solid content concentration become 60% by weight and heated at reflux while stirring with a magnetic stirrer for 120 minutes to obtain the epoxy composition.

(2) Preparation of poly (paraphenylene terephthalamide) dope

Using a 5 liter reactor equipped with a stirring blade, a thermometer, a nitrogen introducing tube and a powder inlet, poly(paraphenylene terephthalamide) was polymerized. After the polymerization reactor was sufficiently dried, NMP (2300 g) and dried calcium chloride (148 g) were added and the mixture was completely dissolved at the bulk temperature of 85° C. After cooling until the bulk temperature becomes room temperature, PPD (73.1 g) was added. Then, the mixture was dissolved and TPC(133.2 g) was gradually added while maintaining the bulk temperature at 18° to 22° C. After the completion of the addition of TPC, the reaction solution was aged at a temperature of 18° to 22° C. for 1 hour to obtain a stable polymer solution (hereinafter abbreviated to a "PPTA dope"). An inherent viscosity was 1.97 dl/g.

(3) Production of aramid porous film

The PPTA dope (233 g) of the above item (2) was diluted with NMP (233 g) to obtain a dope for coating. The dope was applied on a PET film having a thickness of 0.1 mm in an application rate of 0.2 m/minute using a bar coater manufactured by Tester Sangyo Co., Ltd. so that a film thickness becomes 1.2 mm. After the dope was solidified in deionized water, the PET film was washed in flowing deionized water for 4 hours. Both surfaces of the resultant film-like material in the wet state was sandwiched with a meta-aramid felt and then placed on an aluminum plate having a thickness of 3 mm. The film-like material was wrapped up in a vacuum packaging, sealed with a sealing material and then dried at 120° C. for 4 hours while evacuating to obtain a porous film. A percentage of vacant spaces was 43.0% and a linear thermal expansion coefficient was −1.6×10$^{-6}$/°C.

(4) Production of prepreg

The porous film of the above item (3) was used. A film thickness was 40 μm. A varnish for impregnation was prepared by mixing a 30% NMP solution (10.5 g) of polyether sulfon (Sumika Excell PES5003P manufactured by Sumito Chemical Industries Co., Ltd., hereinafter abbreviated to "PES") with a 40% MEK solution (10.5 g) of a solid content of the epoxy composition of the above item (1) and diluting the mixture with MEK (5 g). At this time, a polymer-like material considered to as white PES was deposited. However, when stirring with a spatula, the polymer-like material is easily dissolved to turn into a transparent varnish.

A porous film was placed on a polyethylene film and the varnish for impregnation was applied on the porous film using a brush for varnish. Another polyethylene film was laminated thereon and, few minutes after laminating, the varnish permeated through to the opposite side. After turning over the whole one, the polyethylene film was peeled off, and then a varnish for impregnation was applied thinly and a polyethylene film was laminated again. Few minutes after laminating, the porous film impregnated with the varnish was taken out and dried at 120° C. for 20 minutes. The resultant prepreg was flexible. An amount of a matrix resin (the total amount of PES and the epoxy composition (only solid content)) contained in the prepreg was 47%.

(5) Curing and measurement of physical properties

The prepreg of the item (4) was placed between spacers, sandwiched between a Teflon sheet and then press-cured at 175° C. This prepreg was sandwiched between copper foils having a thickness of 35 μm, and then the resultant was placed between spacers and press-cured at 175° C. The results of the measurement of physical properties are shown in Table 2.

Example 10

(1) Preparation of cyanate composition

A prepolymer (50 g) prepared by partially trimerized 2,2-bis(4-cyanatephenyl)propane with heating, Sumiepoxy ESB-400 (25 g, manufactured by Sumitomo Chemical Industries Co., Ltd.), Sumiepoxy ESCN-195XL (25 g, manufactured by Sumitomo Chemical Industries Co., Ltd.) and zinc naphthenate (0.1 g) as a catalyst were charged in a 300 ml Erlenmeyer flask. A solvent for dilution, MEK was further added and the mixture was adjusted so that the solid content concentration becomes 60% by weight and stirred with a magnetic stirrer for 120 minutes to obtain the cyanate composition.

(2) Production of prepreg

According to the same manner as that described in the process of the item (4) of Example 9, a prepreg was produced. As a varnish for impregnation, a mixture of a 25% NMP solution (36 g) of PES and a 25% MEK solution (36 g) of the solid content of the cyanate composition was used.

An amount of a matrix resin (the total amount of PES and the epoxy composition (only solid content)) contained in the prepreg was 45%.

(3) Curing and measurement of physical properties

According to the process of the item (5) of Example 9, a cured material was produced. The results of the measurement of physical properties are shown in Table 2.

EXAMPLE 11

(1) Production of film comprising PPTA and PES

To the PPTA dope (233 g) of the above item (2) of Example 9 was added a 30% NMP solution (11.7 g) of PES and the mixture was diluted with NMP (455 g). The resultant dope was applied on a PET film having a thickness of 0.1 mm in an application rate of 0.2 m/minute using a bar coater manufactured by Tester Sangyo Co., Ltd. so that a film thickness becomes 1.2 mm. After the dope was solidified in deionized water, the PET film was washed in flowing deionized water for 4 hours. Both surfaces of the resultant film-like material in the wet state was sandwiched with a meta-aramid felt and then placed on an aluminum plate having a thickness of 3 mm. The film-like material was wrapped up in a vacuum packaging, sealed with a sealing material and then dried at 120° C. for 4 hours while evacuating to obtain a film.

(2) Production of prepreg

According to the same manner as that described in the item (2) of Example 10 except for using the porous film of the above item (1), a prepreg was produced.

An amount of a matrix resin (the total amount of PES and the epoxy composition (only solid content)) contained in the prepreg was 58%.

(3) Curing and measurement of physical properties According to the process of the item (5) of Example 9, a cured material was produced. The results of the measurement of physical properties are shown in Table 2.

TABLE 2

|  | Water absorption (%) | Linear thermal expansion coefficient ($\times 10^{-6}$/°C.) | Copper peeling strength (Kg/cm) |
| --- | --- | --- | --- |
| Example 9 | 3.5 | 3.8 | 1.25 |
| Example 10 | 3.5 | 5.3 | 1.00 |
| Example 11 | 2.5 | 19.9 | 1.00 |

What is claims is:

1. A prepreg comprising a porous para-oriented aromatic polyamide film impregnated with a thermoplastic resin and/or a thermosetting resin, wherein the porous para-oriented aromatic polyamide film is composed of para-aramid fibrils having a diameter of not more than 1 μm, with the fibrils planarly arranged as a network or a nonwoven fabric and laminated in layer form, and the film has a linear thermal expansion coefficient at 200° to 300° C. of ±50× $10^{-6}$/°C. and has 30 to 95% of vacant spaces.

2. The prepreg according to claim 1, wherein the prepreg comprises a porous para-oriented aromatic polyamide film impregnated with a thermoplastic resin and a thermosetting resin.

3. The prepreg according to claim 1, wherein the para-oriented aromatic polyamide is poly(paraphenyleneterephthalamide), poly(parabenzamide), poly(4,4'-benzanilideterephthalamide), poly(paraphenylene-4,4'-biphenylenedicarboxylic acid amide), poly(paraphenylene-2,6-naphthalenedicarboxylic acid amide), poly(2-chloro-paraphenyleneterephthalamide) or a copolymer of paraphenylenediamine/2,6-dichloroparaphenylenediamine/terephthaloyl dichloride.

4. The prepreg according to claim 1, wherein the thermoplastic resin is polyether sulfon, polysulfon, polyether imide, polysulfide sulfon or polycarbonate.

5. The prepreg according to claim 1, wherein the thermosetting resin is an epoxy resin, a bismaleimide-triazine resin, a polyimide resin, a diallyl phthalate resin, an unsaturated polyester resin, a cyanate resin or an allyl-modified polyphenylene ether resin.

\* \* \* \* \*